United States Patent [19]

Ooyabu et al.

[11] Patent Number: 5,603,308
[45] Date of Patent: Feb. 18, 1997

[54] IGBT DRIVING CIRCUIT AND IGNITION DEVICE

[75] Inventors: Shinji Ooyabu, Anjo; Mitsuyasu Enomoto, Kariya, both of Japan

[73] Assignee: Nippondenso Co., Ltd., Kariya, Japan

[21] Appl. No.: 551,342

[22] Filed: Nov. 1, 1995

[30] Foreign Application Priority Data

Nov. 4, 1994 [JP] Japan .................................. 6-271490

[51] Int. Cl.⁶ .................. F02P 3/05; G05F 1/575
[52] U.S. Cl. .................. 123/644; 315/224; 323/284; 327/322
[58] Field of Search ............... 123/644; 315/224, 315/209 T; 323/284; 327/322

[56] References Cited

U.S. PATENT DOCUMENTS

| 5,045,964 | 9/1991 | Bennett et al. | 123/644 |
| 5,397,964 | 3/1995 | Edwards | 315/209 T |

FOREIGN PATENT DOCUMENTS 4-143457  5/1992  Japan .

Primary Examiner—Andrew M. Dolinar
Attorney, Agent, or Firm—Cushman, Darby & Cushman IP group of Pillsbury Madison & Sutro LLP

[57] ABSTRACT

An IGBT driving circuit includes an IGBT connected in series with a primary winding of an ignition coil and a current detecting resistor. A transistor is connected to the gate of the IGBT to apply a gate voltage in response to an ignition signal. A comparator compares a voltage produced across the current detecting resistor with a comparison voltage. An NPN transistor connected to the gate of the IGBT turns on and off in response to the comparison result of the comparator to adjust the gate voltage. The gate voltage is fed back to the detection terminal side of the comparator for oscillation suppression through an oscillation suppressing resistor. A charge/discharge control resistor is connected between the gate of the IGBT and the oscillation suppressing resistor and a diode is connected in parallel with the charge/discharge control resistor, so that the electric current flowing to the IGBT is maintained constant.

6 Claims, 4 Drawing Sheets

IGBT DRIVING CIRCUIT AND IGNITION DEVICE

CROSS REFERENCE TO RELATED APPLICATION

This application is based upon and claims priority from Japanese Patent Application No. 6-271490, filed on Nov. 4, 1994, the content of which is incorporated herein by reference.

BACKGROUND OF THE INVENTION

1. Field of the Invention

The present invention relates generally to a driving circuit for IGBT (insulated-gate type bipolar transistor) and, more particularly, to a constant current circuit which controls a primary current of an ignition coil of an internal combustion engine ignition device used in various automotive vehicles.

2. Description of Related Art

As a primary current control circuits for ignition coils in internal combustion engine ignition devices, bipolar transistors have been used. That is, as illustrated in FIG. 8, NPN transistors 25 and 26 are connected in Darlington configuration. The collector current Ic of the Darlington transistor is detected by a primary current detecting resistor 27 to control the collector current Ic of the Darlington transistor. A comparator 28 compares the detection voltage across the primary current detecting resistor 27 with a comparison voltage and controls a base current control transistor (NPN transistor) 29 thereby to control the base current IB of the Darlington transistor. Thus, the electric current determined by the current amplification factor hFE of the Darlington transistor is produced. In order to suppress oscillation of the collector current Ic, an oscillation suppressing resistor 30 is connected between the base terminal of the Darlington transistor and the detection terminal side of the comparator 28. By feeding back the base voltage VBE to the detection terminal side of the comparator 28 through the oscillation suppressing resistor 30, the base current IB is suppressed from oscillation even when the current value detected by the primary current detecting resistor 27 is less than a predetermined value.

In such a circuit arrangement, however, since the bipolar transistors are used, the greater base current IB is required therefor. The electric power consumed by a base current control transistor (driving transistor) 31 which turns on and off in response to an ignition signal IGt and by a base current limiting resistor (driving resistor) 32 becomes greater and electric circuit components of greater power capacity are required. That is, the driving transistor 31 and the driving resistor 32 must amplify the current by the determined current amplifying factor hFE thereby to increase the collector current Ic of the bipolar transistors while the driving resistor 32 must have a resistance value of about several hundreds of ohms thereby to increase the collector current Ic of the bipolar transistors flowing through the driving resistor 32. Thus, both the driving resistor 32 and the driving transistor 31 require greater electric power capacity.

It may be conceived to replace the Darlington transistor in the constant current control circuit in FIG. 8 by an IGBT (insulated-gate type bipolar transistor) so that the electric power consumption at the driving stage may be reduced.

With the IGBT replaced for the Darlington transistor in FIG. 8, however, because the gate voltage of the IGBT is pulled down instantaneously by the NPN transistor 29, it is not possible to stabilize the gate voltage of the IGBT for keeping the collector current value at a constant value.

SUMMARY OF THE INVENTION

It is therefore an object of the invention to provide an IGBT driving circuit and an ignition device in which a constant current control can be attained stably.

According to a first aspect of the present invention, a driving switching element driven by a driving signal applies a predetermined voltage to a gate terminal of an IGBT. A comparator compares a voltage corresponding to a voltage produced across terminals of a current detecting resistor with a comparison voltage and turns on and off a constant current control transistor based on the comparison result thereof so that a gate voltage of the IGBT is adjusted to keep the current flowing to the IGBT at a constant value. An oscillation suppressing resistor feeds back the gate voltage of the IGBT to the detection terminal side of the comparator to suppress the oscillation of the current flowing to the IGBT. A charge/discharge control resistor connected between the gate terminal of the IGBT and the oscillation suppressing resistor slows down a speed of charging and discharging of a stray capacitance of the IGBT thereby to stabilize the current flowing to the IGBT.

Preferably, a semiconductor element connected in parallel with the charge/discharge control resistor is provided to speed up the discharging speed only, avoid heat generation of the IGBT caused by a switching delay and avoid secondary voltage drop of the ignition coil.

More preferably, the IGBT is connected in series with a primary winding of an ignition coil of an ignition device for an internal combustion engine.

BRIEF DESCRIPTION OF THE DRAWINGS

Other features, characteristics and advantages of the invention will become more apparent to a person of ordinary skill in the art based upon the following detailed description, drawings and claims. In the accompanying drawings:

DETAILED DESCRIPTION OF THE PRESENTLY PREFERRED EMBODIMENTS

The present invention will be described in detail below with reference to embodiments illustrated in the accompanying drawings.

Figure 1:
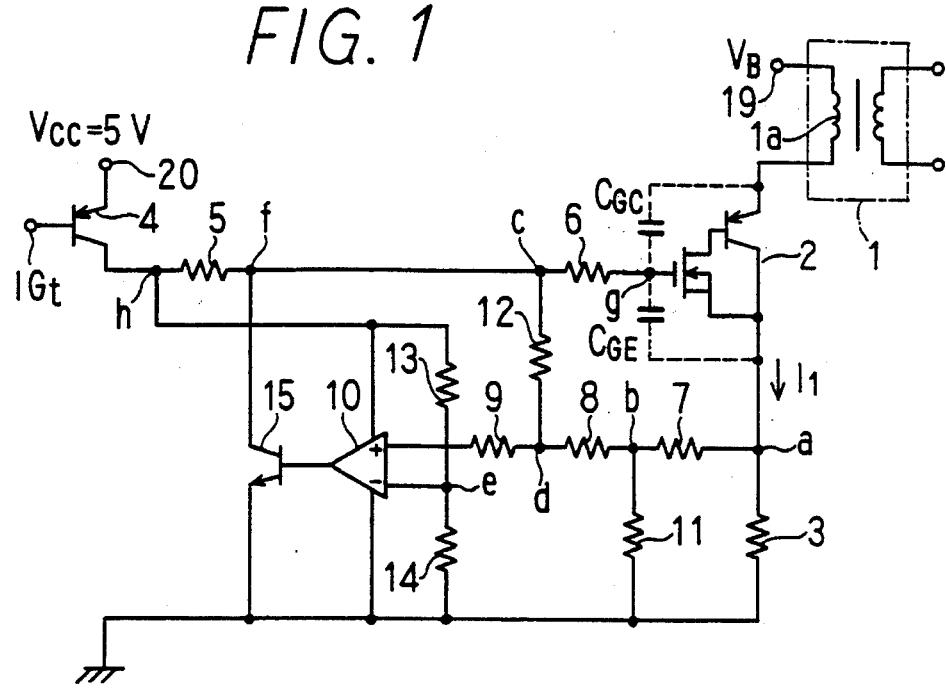
FIG. 1 is an electric wiring diagram of an ignition device according to an embodiment of the present invention.

As illustrated in FIG. 1, an ignition device for internal combustion engines has an ignition coil 1 having a primary winding 1a, one end and the other end of which are connected to a battery terminal (VB=14 V) 19 and to the ground through a series circuit of an IGBT (insulated-gate type bipolar transistor) 2 and a current detecting resistor 3, respectively. The IGBT 2 has, as illustrated in the figure, an FET (field effect transistor) connected across the base-emitter path of a bipolar transistor and has a gate terminal (electrode), collector terminal and an emitter terminal. With the IGBT 2 turned on, an electric current (a primary current I1 of the ignition coil 1) flows from the battery terminal 19 to the ground through the primary winding 1a of the ignition coil 1, IGBT 2 and the current detecting resistor 3. The current detecting resistor 3 converts the magnitude of the current I1 to a voltage value.

When the IGBT 2 turns on, a stray capacitance CGC is formed across the gate-collector path of the IGBT 2 while a stray capacitance CGE is formed across the gate-emitter path of the IGBT 2. A sum of the two stray capacitances becomes a gate input capacitance Ciss (=CGC+CGE).

The gate terminal of the IGBT 2 is connected to a constant voltage terminal (Vcc=5 V) 20 through a driving PNP transistor 4 as a driving switching element and a series circuit of a resistor 5 and a charge/discharge control resistor 6. The driving PNP transistor 4 receives at the base terminal thereof an ignition signal (driving signal) IGt and turns on upon receiving of the ignition signal IGt at a specified ignition timing. With the driving PNP transistor 4 turning on in response to the ignition signal (driving signal) IGt, the voltage Vcc (=5 V) is applied to the gate terminal of the IGBT 2.

A junction "a" between the emitter terminal of the IGBT 2 and the current detecting resistor 3 is connected to the non-inverting input terminal (detection terminal) of a comparator 10 through a series circuit of resistors 7, 8 and 9. A junction "b" between the resistors 7 and 8 is grounded through a resistor 11. Further, a junction "c" between the resistors 5 and 6 and a junction "d" between the resistors 8 and 9 are connected to each other through an oscillation suppressing resistor 12. The oscillation suppressing resistor 12 divides the voltage across the gate-emitter path of the IGBT 2 to provide the comparator 10 with a positive feedback. The gate-emitter voltage is divided by the oscillation suppressing resistor 12 and a combined resistor network in which the resistor 8 is connected in series with the resistor 11 connected in parallel to the serially-connected resistors 3 and 7.

The junction "h" between the driving PNP transistor 4 and the resistor 5 is grounded through a series circuit of resistors 13 and 14 and a junction "e" between the resistors 13 and 14 is connected to an inverting input terminal of the comparator 10 to provide the comparison voltage. The comparator 10 is supplied with the voltage of the junction "d" and the ground voltage. Thus, the comparator 10 compares a voltage corresponding to the voltage produced across the current detecting resistor 3 at the junction "a", i.e., a voltage corresponding to the primary current I1 of the ignition coil 1, with a divided voltage (comparison voltage) divided by the resistors 13 and 14. The comparator 10 produces an L-level or H-level signal based on the comparison of the two input voltages.

A junction "f" same as the junction "c" between the resistors 5 and 6 is grounded through an NPN transistor 15 used as a constant current control switching element. The base terminal of the NPN transistor 15 is connected to the output terminal of the comparator 10. The NPN transistor 15 turns on and off in response to the H-level and L-level output signals of the comparator 10, respectively.

The operation of the embodiment constructed as above will be described next with reference to time charts illustrated in FIGS. 2A through 2D.

When the ignition signal (driving signal) IGt is applied to the driving PNP transistor 4, the driving transistor 4 turns on. Then, the constant voltage Vcc is applied to the charge/discharge control resistor 6 through the resistor 5 and the IGBT 2 turns on. With the turning on of the IGBT 2, the electric current (primary current I1 of the ignition coil 1) starts to flow from the battery terminal (VB) 19 to the ground side through the primary winding 1a, IGBT 2 and the current detecting resistor 3 at the timing t1 in FIG. 2A.

The primary current I1 is converted to the voltage by the current detecting resistor 3 and the comparator 10 compares this detection voltage with the comparison voltage. When the detection voltage is less than the comparison voltage, the comparator 10 applies the L-level signal to the base terminal of the NPN transistor 15. With the L-level signal applied to the base terminal, the NPN transistor 15 is kept turned off to increase the primary current I1.

Figure 2A:
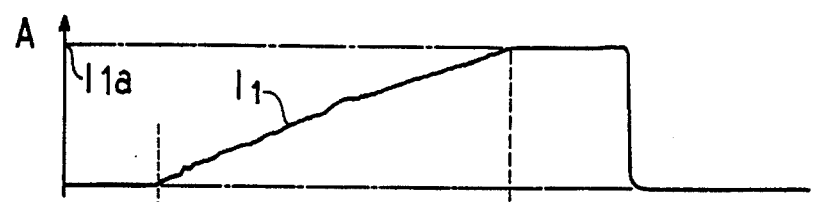
FIGS. 2A through 2D are time charts illustrating operational mode of the ignition device according to the embodiment of FIG. 1.
Figure 2B:
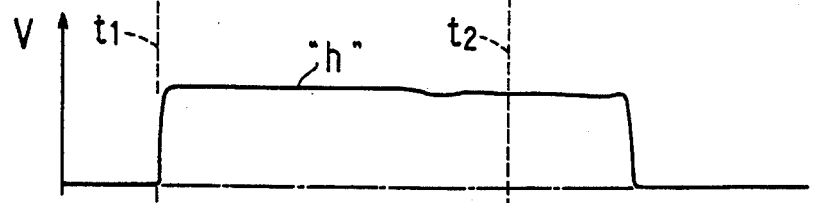
Figure 2C:
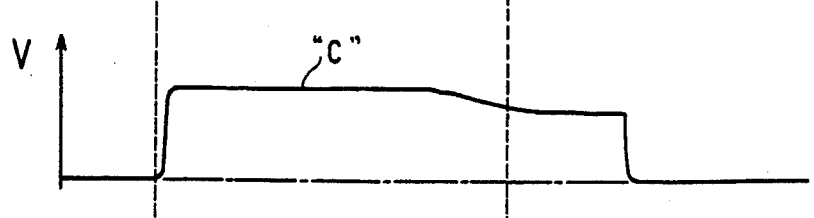
Figure 2D:
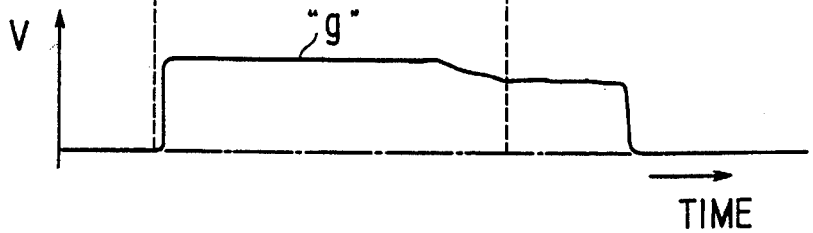

When the primary current I1 of the ignition coil 1 increases gradually and reaches a predetermined current value I1a thereafter at the timing t2 in FIG. 2A, the comparator 10 applies the H-level signal to the base terminal of the NPN transistor 15 to turn on the NPN transistor 15 which in turn lowers the gate voltage of the IGBT 2.

Thus, the NPN transistor 15 turns on and off in response to the output signal of the comparator 10 and, by adjusting the gate voltage of the IGBT 2, keeps the current flowing to the IGBT 2 constant. The gate voltage of the IGBT 2 is fed back through the oscillation suppressing resistor 12 to the detection terminal side of the comparator 10 thereby to suppress the oscillation of the current flowing to the IGBT 2.

Further, the speed of charging and discharging of the gate input capacitance Ciss pulled down by the NPN transistor 15 is slowed down by the charge/discharge control resistor 6. Therefore, the value of the primary current I1 of the ignition coil 1 is stabilized and does not change instantaneously. That is, without the charge/discharge control resistor 6, the gate voltage of the IGBT 2 is pulled down instantaneously to the L-level by the NPN transistor 15 to cause the oscillation of the primary current I1 of the ignition coil 1. With the charge/discharge control resistor 6, on the other hand, the response speed of the positive feedback is slowed down (CR time constant is increased) and the charging and discharging speed of the gate input capacitance Ciss is slowed down or smoothed to suppress oscillation.

By providing the comparator 10 with the positive feedback through the charge/discharge control resistor (gate resistor) 6, the constant current control is attained keeping the gate input capacitance Ciss (=CGC+CGE) constant.

Figure 3:
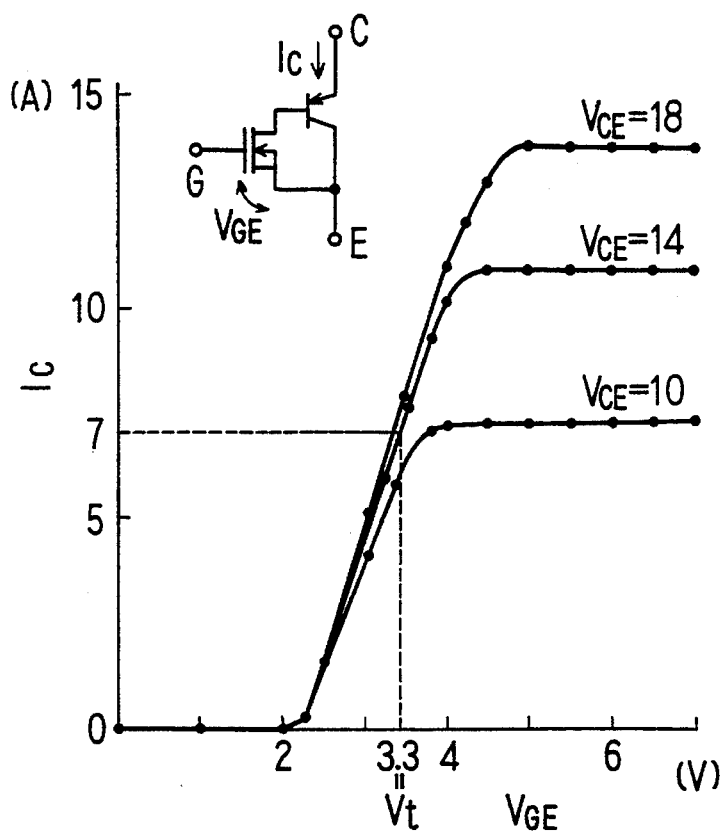
FIG. 3 is a characteristic graph illustrating a relationship between a gate-emitter voltage VGE and a collector current Ic of an IGBT.

FIG. 3 illustrates a relationship, measured under the room temperature, between the gate-emitter voltage VGE and the collector current Ic of the IGBT 2. It should be understood that it is necessary to lower the voltage VGE from the input voltage Vcc to Vt (=3.3 V) and keep it to keep the constant current of 7A (amperes) required for the primary winding 1a.

Thus, as long as the gate-emitter voltage VGE is above the predetermined voltage Vt, the collector current Ic of 7A can be produced. The required electric power capacity of the driving transistor 4 may be less than that required in the case of the conventional circuit configuration illustrated in FIG. 8.

Figure 4:
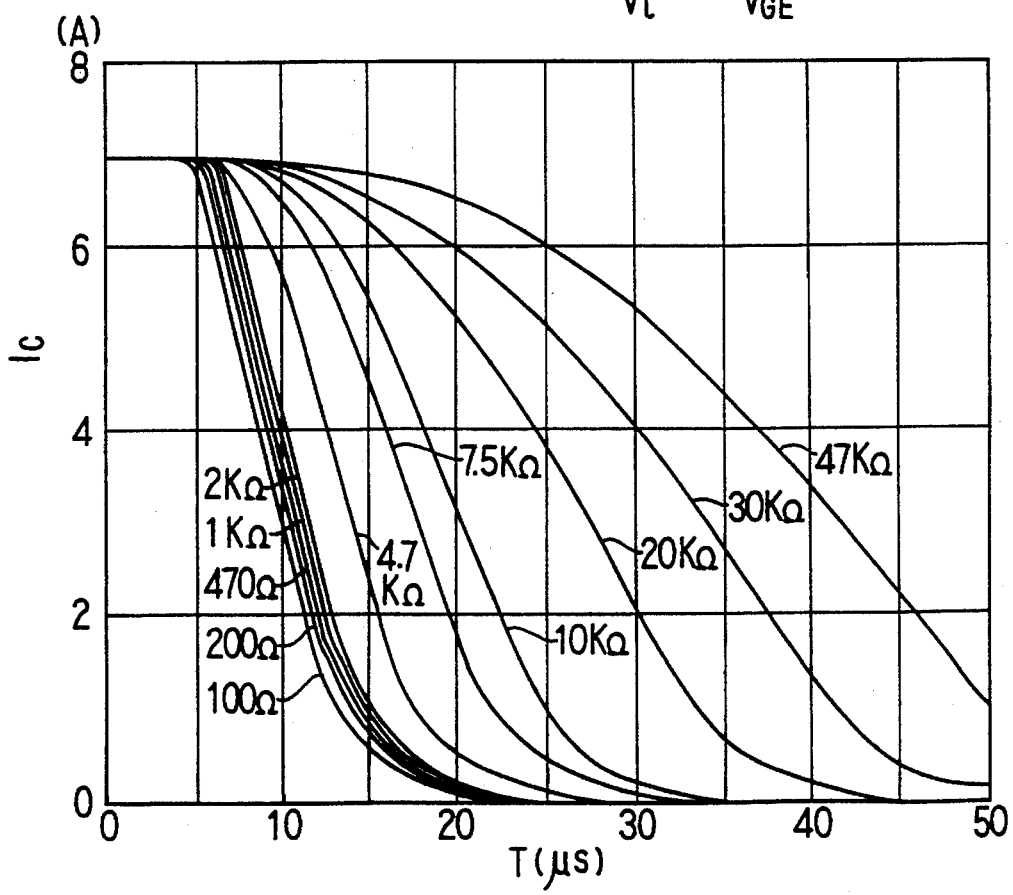
FIG. 4 is a graph illustrating switching delays actually measured with varying gate resistance values of the IGBT.

The gate input capacitance Ciss of the IGBT 2 is from 1,000 pF to 2,000 pF in this embodiment. The result of measurement of the discharging speed is illustrated in FIG. 4. It will be understood from this measurement result that the appropriate resistance value of the charge/discharge control resistor 6 is from 500 to 10KΩ and the heat generation of the IGBT 2 (proportional to Ic and VCE) due to switching delay is expected to be reduced.

It will be possible to suppress the constant current oscillation further and stabilize the constant current value by setting the charge/discharge control resistor 6 to be greater than 10KΩ to slow down the charging and discharging speed of the gate input capacitance Ciss. This will cause, however, increase in the heat generation of the IGBT 2 caused by the switching delay at the time of turning off of the IGBT 2.

Figure 5:
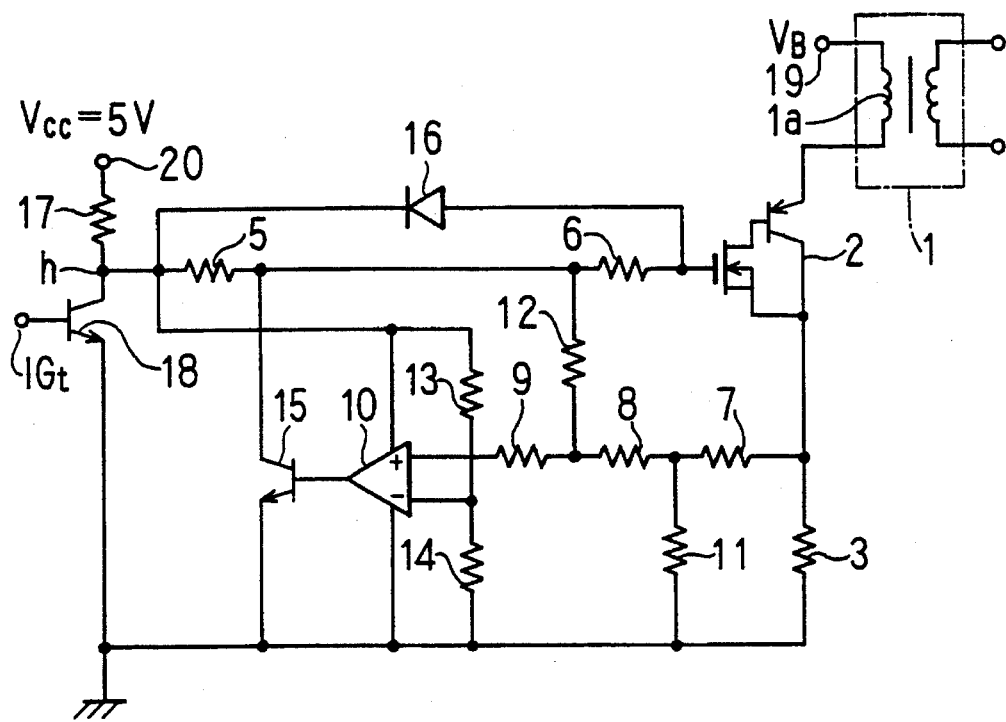
FIG. 5 is an electric wiring diagram of an ignition device according to another embodiment of the present invention.

In order to reduce only the switching delay (speeding up the turning off of the IGBT 2), as illustrated in FIG. 5, diode 16 may be connected parallelly to the charge/discharge control resistor 6 in opposite direction to the charging direction to slow down the discharging speed only. As opposed to the embodiment of FIG. 1 in which the gate terminal of the IGBT 2 is connected to the constant voltage source Vcc (5 V) through the driving PNP transistor 4, the embodiment illustrated in FIG. 5 is modified in that a series circuit of a resistor 17 and a driving NPN transistor 18 is connected between the constant voltage source Vcc (5 V) and the ground and the gate terminal of the IGBT 2 is connected to a junction "h" between the resistor 17 and the driving NPN transistor 18.

Figure 8:
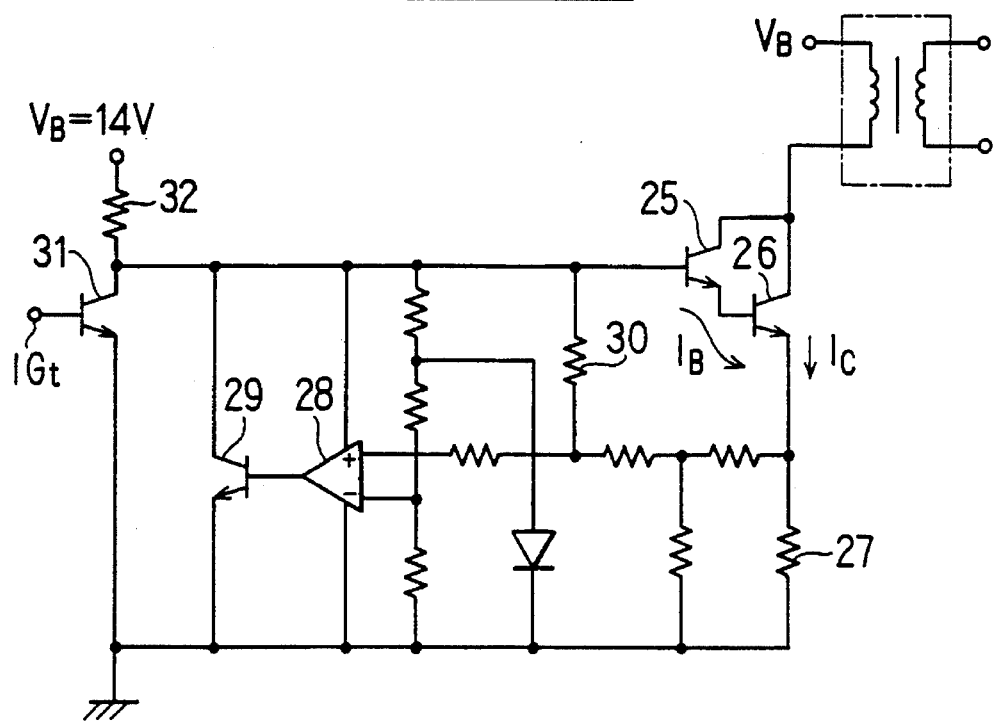
FIG. 8 is an electric wiring diagram of an ignition device according to a prior art.

In both of the embodiments of FIGS. 1 and 5, the required electric power capacity of the driving transistors and the driving resistors may be less than that in FIG. 8. The embodiment of FIG. 1, however, is more practical than the embodiment of FIG. 5, because it requires no driving resistor 17 used in the embodiment of FIG. 5 and the voltage applied to the gate terminal of the IGBT 2 does not fall due to the current flowing into a control circuit portion.

In the foregoing embodiments, the charge/discharge control resistor 6 is provided between the gate terminal of the IGBT 2 and the oscillation suppressing resistor 12. As a result, the gate voltage of the IGBT 2 is fed back to the detection terminal side of the comparator 10 through the oscillation suppressing resistor 12 and the charge/discharge control resistor 6 and the oscillation is suppressed. The charge/discharge control resistor 6 slows down the speed of charging and discharging of the stray capacitance of the IGBT 2 thereby to stabilize the constant current value (primary current value of the ignition coil).

Further, the diode 16, which is connected as illustrated in FIG. 5 in parallel with the charge/discharge control resistor 6 to allow the current flow only in the direction of discharging, speeds up only the discharging speed so that heat generation of the IGBT caused by the switching delay may be avoided.

Figure 6:
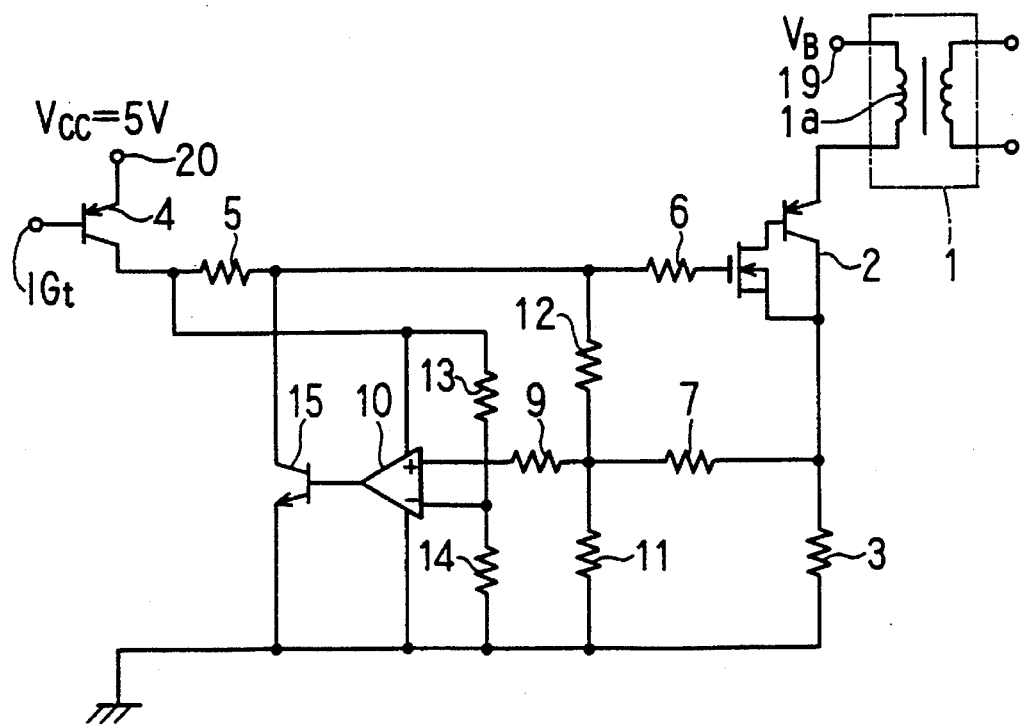
FIG. 6 is an electric wiring diagram of an ignition device according to a further embodiment of the present invention.
Figure 7:
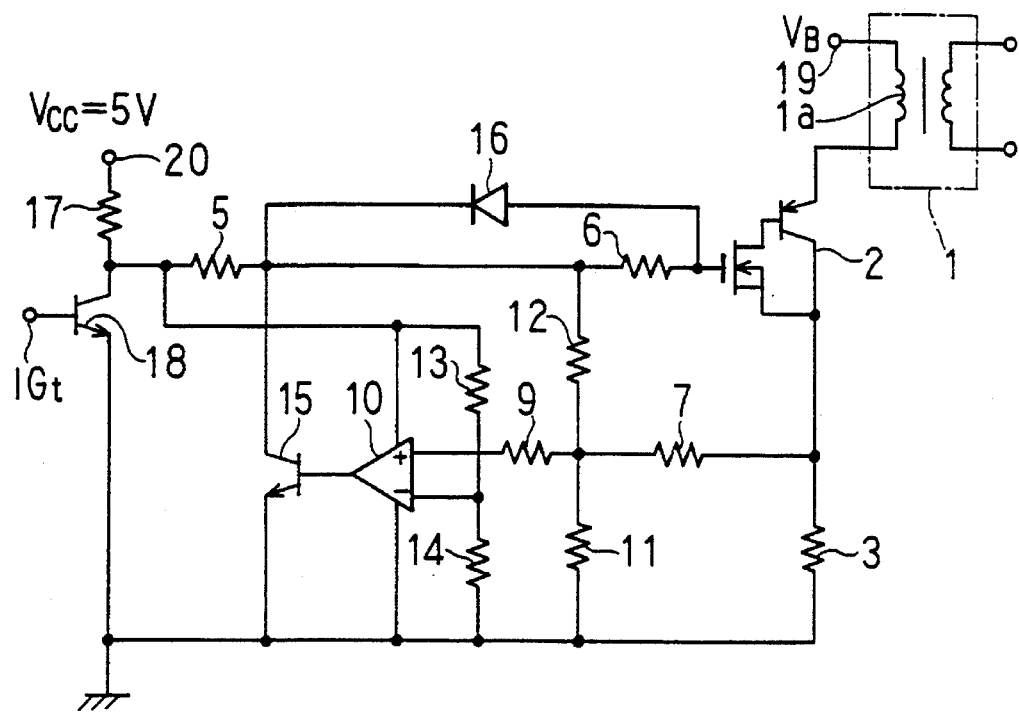
FIG. 7 is an electric wiring diagram of an ignition device according to a still further embodiment of the present invention.

The voltage dividing circuit configuration in the embodiments of FIGS. 1 and 5 may be modified as illustrated in FIGS. 6 and 7, respectively. More specifically, the resistor 8 in FIG. 1 may be eliminated as illustrated in FIG. 6 and the resistor 8 in FIG. 5 may be eliminated as illustrated in FIG. 7.

In addition, although the diode 16 is connected to the ends of the charge/discharge control resistor 6 in FIG. 7, it may be connected to the ends of a series connection of the resistors 5 and 6 as in the embodiment of FIG. 5.

The present invention has been described in connection with what are presently considered to be the most practical and preferred embodiments of the invention. However, the present invention is not meant to be limited to the disclosed embodiments, but rather is meant to cover all modifications and equivalent arrangements included within the spirit and scope of the appended claims.

What is claimed is:

1. A driving circuit for a semiconductor switching element having a stray capacitance and connected to an electric load, the driving circuit comprising:

a gate voltage input terminal connected to a gate terminal of the semiconductor switching element for applying a predetermined voltage as a gate voltage;

a current detecting resistor connected in series with the semiconductor switching element;

a comparator for comparing a detection voltage with a comparison voltage, the detection voltage being applied to a detection terminal side of the comparator and corresponding to a voltage produced across the current detecting resistor;

a constant current control switching element connected to the gate terminal of the semiconductor switching element for turning on and off in response to comparison results of the comparator to adjust the gate voltage of the gate terminal of the semiconductor switching element so that an electric current flowing to the semiconductor switching element element is kept constant;

a charge/discharge control resistor connected between the gate terminal of the semiconductor switching element and the constant current control switching element, wherein the semiconductor switching element is an IGBT, and an oscillation suppressing resistor connected between the charge/discharge control resistor and the detection terminal side of the comparator for feeding back the gate voltage of the IGBT to the detection terminal side of the comparator for suppressing an oscillation of an electric current flowing to the IGBT.

2. The driving circuit according to claim 1, wherein the electric load includes:

an ignition coil having a primary winding connected in series with the Semiconductor switching element.

3. A driving circuit for a semiconductor switching element having a stray capacitance and connected to an electric load, the driving circuit comprising:

a gate voltage input terminal connected to a gate terminal of the semiconductor switching element for applying a predetermined voltage as a gate voltage;

a current detecting resistor connected in series with the semiconductor switching element;

a comparator for comparing a detection voltage with a comparison voltage, the detection voltage being applied to a detection terminal side of the comparator and corresponding to a voltage produced across the current detecting resistor;

a constant current control switching element connected to the gate terminal of the semiconductor switching element for turning on and off in response to comparison results of the comparator to adjust the gate voltage of the gate terminal of the semiconductor switching element so that an electric current flowing to the semiconductor switching element is kept constant;

a charge/discharge control resistor connected between the gate terminal of the semiconductor switching element and the constant current control switching element, wherein the semiconductor switching element is an IGBT, and a second semiconductor switching element connected in parallel relation to the charge/discharge control resistor for flowing an electric current only in a discharging direction.

4. The driving circuit according to claim 3, wherein the electric load includes:

an ignition coil having a primary winding connected in series with the semiconductor switching element.

5. A driving circuit for an IGBT switching element connected to an electric load, the circuit comprising:

a gate voltage input terminal for receiving a gate voltage of the IGBT;

current detecting means for detecting an electric current flowing through the IGBT;

comparing means for comparing the detected current with a predetermined comparison value;

first switching means connected to the gate of the IGBT switching element for adjusting the application of the gate voltage in response to a comparison result of the comparing means;

charge/discharge control means connected between the gate of the IGBT and the first switching means for controlling charging and discharging of a stray capacitance of the IGBT, wherein said charge/discharge control means includes a resistor, and a second semiconductor switching element connected in parallel to the resistor for changing a speed of the discharging of the stray capacitance from a speed of the charging of the stray capacitance.

6. A driving circuit for an IGBT switching element connected to an electric load, the circuit comprising:

a gate voltage input terminal for receiving a gate voltage of the IGBT;

current detecting means for detecting an electric current flowing through the IGBT;

comparing means for comparing the detected current with a predetermined comparison value;

first switching means connected to the gate of the IGBT switching element for adjusting the application of the gate voltage in response to a comparison result of the comparing means;

charge/discharge control means connected between the gate of the IGBT and the first switching means for controlling charging and discharging of a stray capacitance of the IGBT, and feedback means for feeding back the gate voltage of the IGBT to the comparing means to suppress oscillation of the current flowing through the IGBT due to the adjustment of the gate voltage by the second switching means.

* * * * *